US012605801B2

(12) United States Patent (10) Patent No.: US 12,605,801 B2
Woo et al. (45) Date of Patent: Apr. 21, 2026

(54) CHUCK TABLE MANUFACTURING METHOD

(71) Applicant: DISCO CORPORATION, Tokyo (JP)

(72) Inventors: Junsoo Woo, Tokyo (JP); Tomotaka Tabuchi, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 281 days.

(21) Appl. No.: 18/363,955

(22) Filed: Aug. 2, 2023

(65) Prior Publication Data

US 2024/0058918 A1 Feb. 22, 2024

(30) Foreign Application Priority Data

Aug. 17, 2022 (JP) ................................. 2022-129915

(51) Int. Cl.
| | |
|---|---|
| *B24B 7/22* | (2006.01) |
| *B23Q 3/08* | (2006.01) |
| *B24B 41/06* | (2012.01) |
| *B25B 11/00* | (2006.01) |
| *H01L 21/683* | (2006.01) |
| *H10P 72/78* | (2026.01) |

(52) U.S. Cl.
CPC .............. *B24B 7/228* (2013.01); *B23Q 3/088* (2013.01); *B24B 41/068* (2013.01); *B25B 11/005* (2013.01); *H10P 72/78* (2026.01)

(58) Field of Classification Search
CPC .. B24B 7/228; B24B 7/07; B24B 7/08; B24B 41/068; B24B 41/06; B24B 41/00; B24B 41/061; B24B 1/00; B24B 37/30; B24B 37/34; B24B 37/11; B24B 37/12; B24B 37/14; B24B 37/16; B24B 19/02; B23Q 3/088; H01L 21/6838; B25B 11/005

USPC .............................................. 451/388; 269/21
See application file for complete search history.

(56) References Cited

U.S. PATENT DOCUMENTS

| | | | |
|---|---|---|---|
| 6,193,586 B1 * | 2/2001 | Park ...................... | B24B 41/061 |
| | | | 451/388 |
| 7,992,877 B2 * | 8/2011 | Balan .................. | H01L 21/6838 |
| | | | 269/21 |
| 2020/0013664 A1 * | 1/2020 | Yamamoto ........ | H01L 21/68785 |
| 2022/0093446 A1 * | 3/2022 | Ikeue ................ | H01L 21/67253 |

FOREIGN PATENT DOCUMENTS

| JP | 0332538 A | | 2/1991 |
|---|---|---|---|
| JP | 2007180102 A | * | 7/2007 |
| JP | 2013226607 A | | 11/2013 |
| JP | 2015126208 A | * | 7/2015 |

OTHER PUBLICATIONS

Office Action issued in counterpart Japanese patent application No. 2022429915, dated Mar. 17, 2026.

* cited by examiner

*Primary Examiner* — Michael A Gump
(74) *Attorney, Agent, or Firm* — Greer Burns & Crain Ltd.

(57) ABSTRACT

A chuck table manufacturing method capable of changing over the shape of a holding surface according to at least two workpieces different in area or shape includes a porous plate sticking step of sticking a frame body and a porous plate to each other while the porous plate is accommodated in a recess of the frame body with an upper surface of the porous plate being exposed, a groove forming step of forming, in the porous plate, a groove reaching a bottom surface of the recess, and a resin filling step of filling the groove with a liquid resin and curing the liquid resin.

4 Claims, 5 Drawing Sheets

CHUCK TABLE MANUFACTURING METHOD

BACKGROUND OF THE INVENTION

Field of the Invention

The present invention relates to a chuck table manufacturing method.

Description of the Related Art

In a grinding apparatus for use in manufacturing a semiconductor, rotating grindstones are brought into contact with a workpiece such as a wafer held under suction by a chuck table, to grind the workpiece to a predetermined thickness. In chuck tables described in Japanese Patent Laid-open No. 2013-226607 and Japanese Patent Laid-open No. Hei 03-032538, a holding surface thereof is made to communicate with a suction source, and a wafer is held on the holding surface.

SUMMARY OF THE INVENTION

Incidentally, the chuck table holds under suction a workpiece conforming to a desired size or shape, by changing the area of the holding surface communicating with the suction source. For example, a 12-inch wafer is held under suction, or a 6-inch wafer is held under suction.

A conventional chuck table for holding under suction a wafer conforming to a desired size or shape includes a porous circular plate for sucking a 6-inch wafer, a porous annular plate that is disposed to surround the outside of the porous circular plate and that communicates with a suction source together with the porous circular plate to suck a 12-inch wafer, an annular dense-material barrier disposed between the porous circular plate and the porous annular plate, and a frame body having a recess for accommodating the porous circular plate, the barrier, and the porous annular plate. The chuck table is manufactured by applying an adhesive to an outside surface of the porous circular plate and an inside surface of the barrier, to an outside surface of the barrier and an inside surface of the porous annular plate, and to a bottom surface and an inside surface of the recess, and sticking the porous circular plate, the barrier, and the porous annular plate to the frame body.

In manufacture of such a chuck table, it is necessary to individually manufacture the porous circular plate for sucking the 6-inch wafer, the porous annular plate for sucking the 12-inch wafer, and the dense-material barrier, dispose the barrier to surround the outside of the porous circular plate, dispose the porous annular plate to surround the outside of the barrier, and stick them to one another. In this manufacturing method, the porous circular plate, the porous annular plate, and the barrier are individually manufactured according to the purpose, and these members are stuck to one another. Therefore, there is a problem that the number of working steps in the manufacturing process would be increased, resulting in a low productivity.

Accordingly, it is an object of the present invention to provide a chuck table manufacturing method that enhances the productivity without individually manufacturing porous plates of desired shapes.

In accordance with an aspect of the present invention, there is provided a chuck table manufacturing method capable of changing over the shape of a holding surface according to at least two workpieces different in area or shape. The chuck table manufacturing method includes a porous plate sticking step of sticking a frame body and a porous plate to each other while the porous plate is accommodated in a recess of the frame body with an upper surface of the porous plate being exposed, a groove forming step of forming, in the porous plate, a groove reaching a bottom surface of the recess, after the porous plate sticking step is carried out, and a resin filling step of filling the groove with a liquid resin and curing the liquid resin.

Preferably, a circular groove is formed in the porous plate in the groove forming step. Preferably, a rectilinear groove is formed in the porous plate in the groove forming step.

Preferably, the chuck table manufacturing method further includes a holding surface forming step of grinding the upper surface of the porous plate and the resin filled in the groove by grindstones to form the holding surface, after the resin filling step.

According to the chuck table manufacturing method of the present invention, it is possible to provide a chuck table manufacturing method that enhances the productivity of a chuck table without individually manufacturing porous plates of desired shapes.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A chuck table manufacturing method according to an embodiment of the present invention will be described below with reference to the attached drawings. FIGS. 1 to 5 illustrate the chuck table manufacturing method according to the present embodiment.

Figure 1:
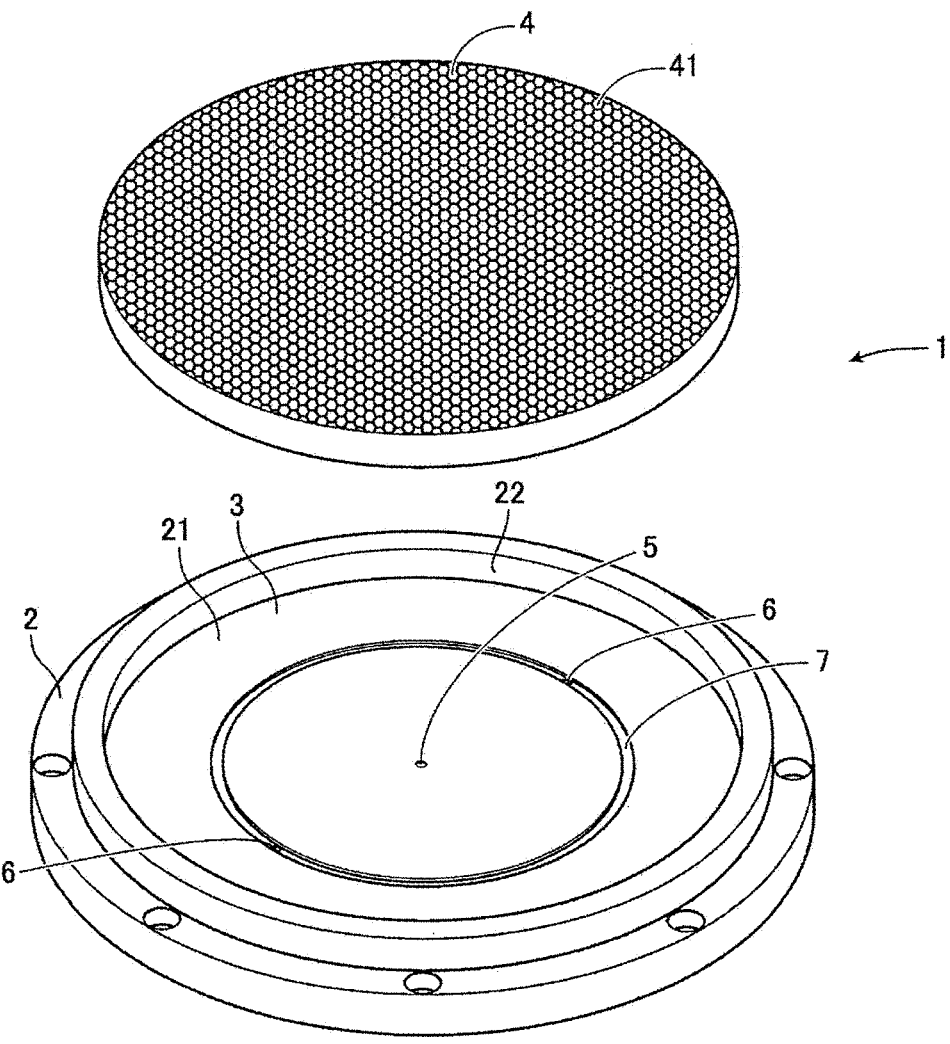
FIG. 1 is a perspective view depicting a state before a manufacturing process starts in a chuck table manufacturing method according to an embodiment of the present invention.

FIG. 1 is a perspective view depicting a state before a manufacturing process starts in the chuck table manufacturing method according to the present embodiment. The chuck table manufacturing method according to the present embodiment is capable of changing over the shape of a holding surface according to at least two workpieces different in area or shape.

A chuck table 1 includes, for example, a metallic frame body 2 having a recess 3 formed in an upper portion thereof and a porous plate 4 mounted inside the recess 3. An upper surface 41 of the porous plate 4 constitutes a holding surface 46 to be described later, and the holding surface 46 holds the workpiece thereon.

In the center of the recess 3, there is formed a first suction hole 5 communicating with an unillustrated suction source. The first suction hole 5 is formed in such a manner that a suction force acts on a first holding surface 47 to be described later.

The recess 3 is formed with a suction groove 7. The suction groove 7 is formed at any place in the recess 3, and is preferably formed in such a manner that a suction force acts on a second holding surface 48 to be described later. For example, as depicted in FIG. 1, the recess 3 preferably has the annular suction groove 7 with the first suction hole 5 as a center. The suction groove 7 has a second suction hole 6 communicating with the unillustrated suction source. The recess 3 has a bottom surface 21 and a side wall surface 22.

In addition, a workpiece to be held on the holding surface 46 (see FIG. 6) of the chuck table 1 is an as-sliced wafer on which devices are yet to be formed, and is formed by slicing a cylindrical ingot with a wire saw.

The manufacturing process according to the chuck table manufacturing method of the present embodiment will be described.

[Porous Plate Sticking Step]

Figure 2A:
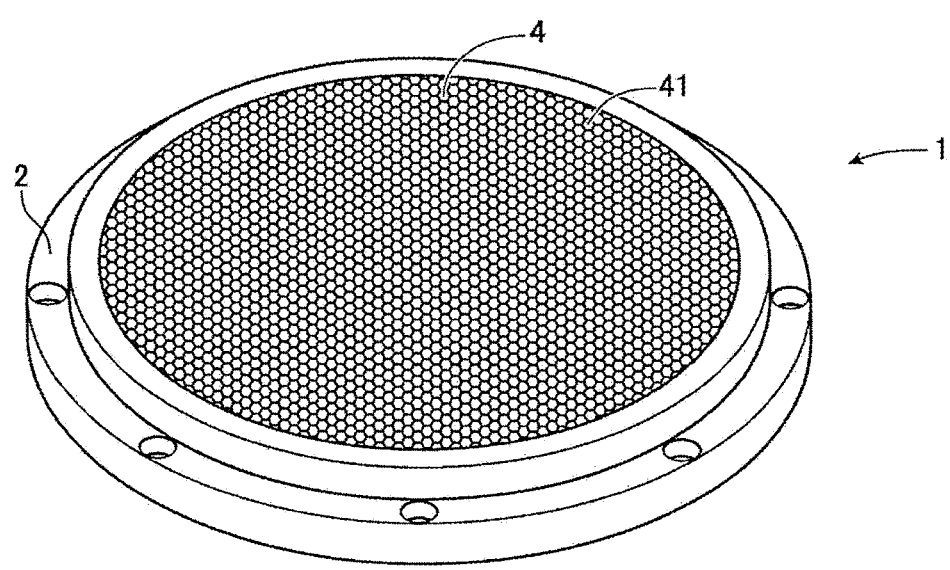
FIG. 2A is a perspective view depicting a state in which a frame body and a porous plate have been stuck to each other in a porous plate sticking step according to the present embodiment.
Figure 2B:
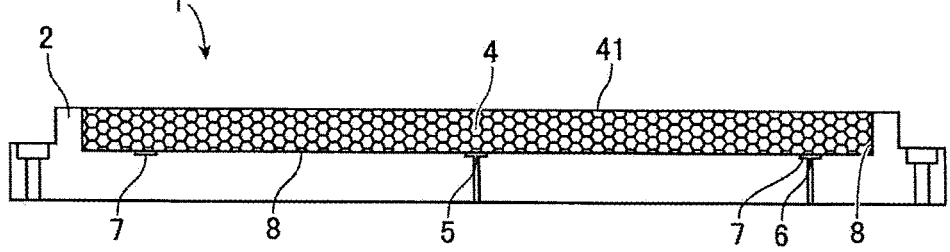
FIG. 2B is a sectional view depicting the state in which the frame body and the porous plate have been stuck to each other in the porous plate sticking step according to the present embodiment.

FIG. 2A is a perspective view depicting a state in which the frame body 2 and the porous plate 4 have been stuck to each other in a porous plate sticking step according to the present embodiment. FIG. 2B is a sectional view depicting the state in which the frame body 2 and the porous plate 4 have been stuck to each other in the porous plate sticking step according to the present embodiment.

The recess 3 is coated with an adhesive 8. The adhesive 8 is applied to a portion on the bottom surface 21 and the side wall surface 22 of the recess 3, the portion not including the first suction hole 5, the second suction hole 6, and the suction groove 7.

As depicted in FIG. 2A, the porous plate 4 is accommodated in the recess 3 of the frame body 2 in a state in which the upper surface 41 of the porous plate 4 is exposed, and the porous plate 4 is stuck to the frame body 2.

As depicted in FIG. 2B, it is preferable that the recess 3 and the porous plate 4 be stuck to each other such that they are completely in close contact with each other at a region other than the first suction hole 5 and the suction groove 7.

[Groove Forming Step]

Figure 3A:
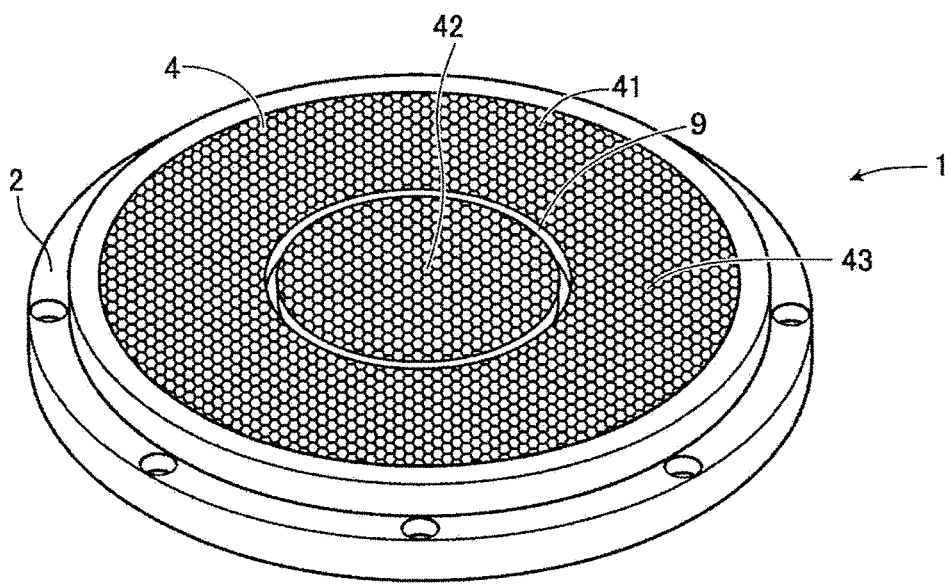
FIG. 3A is a perspective view depicting a groove forming step according to the present embodiment.
Figure 3B:
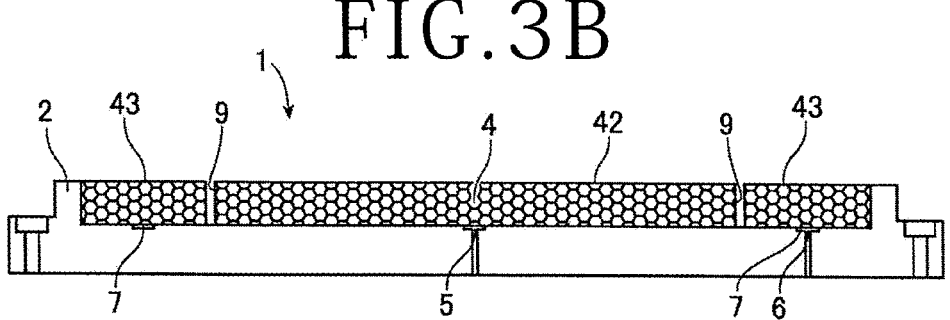
FIG. 3B is a sectional view depicting the groove forming step according to the present embodiment.

FIG. 3A is a perspective view depicting a groove forming step according to the present embodiment. FIG. 3B is a sectional view depicting the groove forming step according to the present embodiment.

As depicted in FIG. 3A, a groove 9 is formed in the porous plate 4. As depicted in FIG. 3B, the groove 9 is formed by cutting the porous plate 4 in such a manner that the groove

9 reaches the bottom surface 21 of the recess 3, according to the desired shape and size of the workpiece.

With the groove 9 thus formed, a first porous part 42 having the first suction hole 5 in a lower portion thereof and an annular second porous part 43 having the second suction hole 6 (the suction groove 7) in a lower portion thereof are formed.

As depicted in FIG. 3A, it is preferable to form a circular groove 9 in the case where a circular workpiece is to be held. In addition, it is preferable to form a rectilinear groove 9 in the case where a rectangular workpiece or a circular plate-shaped workpiece formed with an orientation flat therein is to be held.

Note that, in forming the groove 9 in a rectilinear shape, the first suction hole 5 is formed on one side of the bottom surface 21 with the groove 9 as a boundary, and the second suction hole 6 is formed on the other side of the bottom surface 21.

In the present embodiment, one sheet of the porous plate 4 is stuck to the frame body 2 in the sticking step, and the groove 9 is then formed in the porous plate 4 in the groove forming step. Hence, according to the present embodiment, it is possible to form the holding surface according to the desired workpiece shape without individually manufacturing the porous plates of desired shapes, thereby reducing the number of working steps as compared to the conventional manufacturing process of a chuck table.

[Resin Filling Step]

Figure 4A:
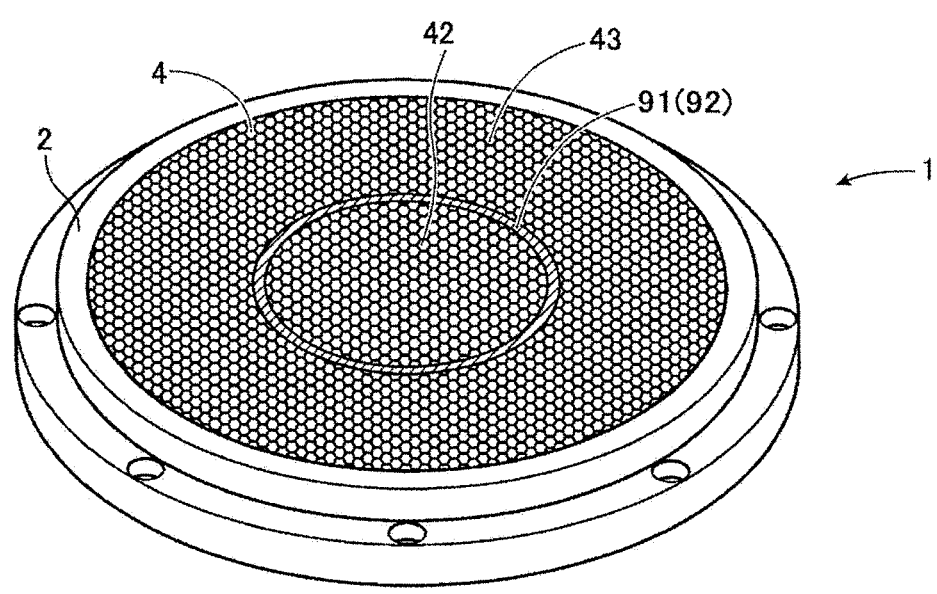
FIG. 4A is a perspective view depicting a resin filling step according to the present embodiment.
Figure 4B:
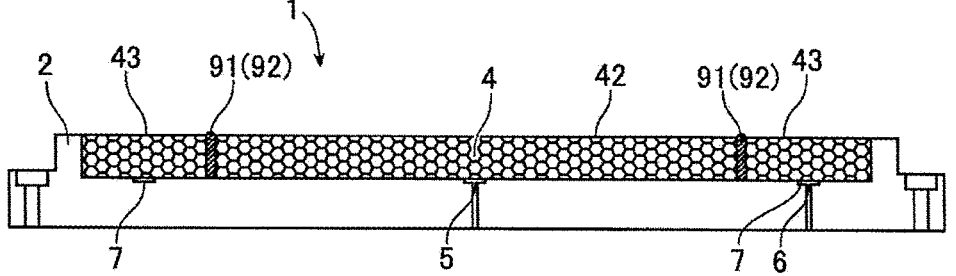
FIG. 4B is a sectional view depicting the resin filling step according to the present embodiment.

As depicted in FIG. 4A, the groove 9 is filled with a liquid resin 91, and the liquid resin 91 is cured to form a barrier 92. As depicted in FIG. 4B, the groove 9 is filled with the liquid resin 91 such that the liquid resin 91 reaches the bottom surface 21 of the recess 3, and the liquid resin 91 is then cured. In addition, it is preferable to fill the groove 9 with the liquid resin 91 such that, when the liquid resin 91 is cured and shrunk, it protrudes relative to upper surfaces of the first porous part 42 and the second porous part 43, from the viewpoint of formation of the flat holding surface 46 in a holding surface forming step which will be described later.

The liquid resin 91 is preferably a thermosetting resin or a ultraviolet-curing resin. In the case where a thermosetting resin is used, the resin is preferably cured by being heated to a temperature of approximately 100° C. In addition, the liquid resin 91 preferably contains a granular aggregate. In addition, the aggregate may be powdery. Note that the liquid resin containing the aggregate is restrained from shrinking at the time of being cured. In addition, in order to make a thermal conductivity equivalent to those of a porous circular plate and a porous annular plate to thereby prevent thermal deformation caused by processing heat produced during a grinding step, the aggregate is preferably an alumina powder, a silicon powder, or a zirconia powder.

The barrier 92 blocks up a space between the first porous part 42 and the second porous part 43. As a result, a suction force generated from an unillustrated suction source can efficiently be transmitted to the first porous part 42 and the second porous part 43 through the first suction hole 5 and the second suction hole 6.

[Holding Surface Forming Step]

Figures 5A, 5B, 6:
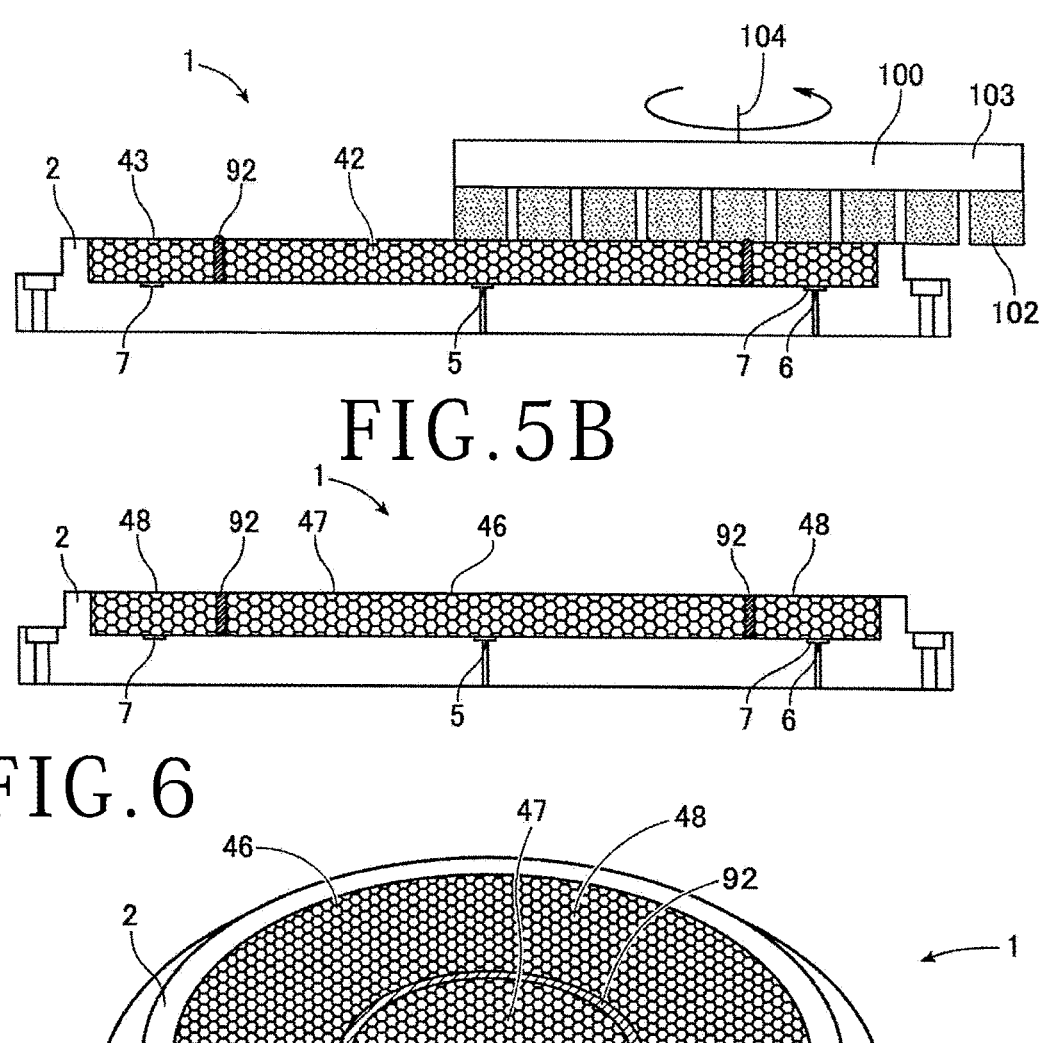
FIG. 5A is a sectional view depicting a state in which grinding in a holding surface forming step according to the present embodiment is being executed.
FIG. 5B is a sectional view depicting a state in which the grinding in the holding surface forming step according to the present embodiment has been executed.
FIG. 6 is a perspective view depicting a chuck table manufactured by the chuck table manufacturing method according to the present embodiment.

FIG. 5A is a sectional view depicting a state in which grinding in a holding surface forming step according to the present embodiment is being executed. FIG. 5B is a sectional view depicting a state in which the grinding in the holding surface forming step according to the present embodiment has been executed.

As depicted in FIG. 4B, an upper surface of the barrier 92 obtained by curing the resin and an upper surface of the frame body 2 are often not flush with the upper surface 41 of the porous plate 4, and hence, they should be made flush with one another.

As depicted in FIG. 5A, after the resin filling step, upper surfaces of the first porous part 42, the second porous part 43, and the barrier 92 are ground by grindstones 102 of a grinding mechanism 100 to form the holding surface 46.

The grinding mechanism 100 includes a plurality of grindstones 102 secured to a lower portion of a mount 103. A spindle 104 connected to an upper portion of the mount 103 is rotated, the grinding mechanism 100 is lowered by an unillustrated lifting mechanism, and the grindstones 102 are thus pressed against an object to be ground. The object to be ground herein corresponds to the respective upper surfaces of the first porous part 42, the second porous part 43, the barrier 92, and the frame body 2. Further, an unillustrated mechanism holding the chuck table 1 or the grinding mechanism 100 is moved horizontally, whereby the upper surface of the object to be ground is ground. The upper surface of the object to be ground is ground uniformly.

As depicted in FIG. 5B, the ground surfaces form the holding surface 46. A portion of the holding surface 46 corresponding to the upper surface of the first porous part 42 serves as a first holding surface 47, and a portion of the holding surface 46 corresponding to the upper surface of the second porous part 43 serves as a second holding surface 48.

By the grinding, the upper surfaces of the first holding surface 47, the second holding surface 48, the barrier 92, and the frame body 2 are made flush with one another, whereby a workpiece can be brought into close contact with the holding surface 46 without a gap therebetween when being held on the holding surface 46 under suction.

After the holding surface forming step, the manufacturing process according to the chuck table manufacturing method of the present embodiment is finished.

In the present embodiment, as depicted in FIG. 6, the chuck table 1 has the first holding surface 47 and the second holding surface 48 which are separated from each other by the barrier 92. With this configuration, it is possible to change over the shape of the holding surface according to at least two workpieces different in area or shape. For example, it is possible to hold under suction a small-area wafer such as a 6-inch wafer on the first holding surface 47 of the first porous part 42, and to hold under suction a large-area wafer such as a 12-inch wafer on the second holding surface 48 of the second porous part 43 together with the first holding surface 47. Hence, it is possible to form the holding surface 46 conforming to the shape or size according to the purpose.

Note that the first porous part 42 is a porous circular plate used in the conventional manufacturing method, the second porous part 43 is a porous annular plate used in the conventional manufacturing method, and the barrier 92 is a dense-material barrier used in the conventional manufacturing method.

In addition, in the present embodiment, after one sheet of the porous plate 4 is stuck to the frame body 2 in the porous plate sticking step, the groove 9 is formed in the groove forming step, whereby it is possible to form the holding surface 46 conforming to a desired workpiece shape without individually manufacturing porous plates of desired shapes, thereby reducing the number of working steps as compared to the conventional chuck table manufacturing process. As a result, the time required for forming the chuck table is shortened, and the productivity of the chuck table is enhanced.

As has been described above, according to the chuck table manufacturing method of the present embodiment, the productivity of the chuck table can be enhanced without individually manufacturing porous plates of desired shapes. Therefore, the chuck table manufacturing method according to the present embodiment is highly applicable to the field of production of a processing apparatus such as a precision apparatus using the workpiece as a material.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A chuck table manufacturing method capable of providing a shape of a holding surface according to at least two workpieces different in area or shape, the chuck table manufacturing method comprising:
   providing a frame body;
   providing a preformed porous plate;
   a porous plate sticking step of sticking the frame body and the preformed porous plate to each other while the preformed porous plate is accommodated in a recess of the frame body with an upper surface of the preformed porous plate being exposed;
   a groove forming step of forming, in the preformed porous plate, a groove reaching a bottom surface of the recess, after the porous plate sticking step is carried out; and
   a resin filling step of filling the groove with a liquid resin and curing the liquid resin.

2. The chuck table manufacturing method according to claim 1, wherein the groove formed in the preformed porous plate in the groove forming step is a groove having a circular peripheral shape.

3. The chuck table manufacturing method according to claim 1, wherein the groove formed in the preformed porous plate in the groove forming step is a rectilinear groove.

4. The chuck table manufacturing method according to claim 1, further comprising:
   a holding surface forming step of grinding the upper surface of the preformed porous plate and the resin filled in the groove by grindstones to form the holding surface, after the resin filling step.

* * * * *